United States Patent [19]

Dakovski et al.

[11] 4,305,138

[45] Dec. 8, 1981

[54] STACK MEMORY DEVICE

[75] Inventors: Lyudmil G. Dakovski; Nikola K. Kassabov, both of Sofia, Bulgaria

[73] Assignee: V M E I "Lenin", Sofia, Bulgaria

[21] Appl. No.: 86,430

[22] Filed: Oct. 19, 1979

[30] Foreign Application Priority Data

Nov. 8, 1978 [BG] Bulgaria ............................ 41323

[51] Int. Cl.³ .......................................... G11C 13/00
[52] U.S. Cl. .................................... 365/73; 365/189
[58] Field of Search ................. 365/78, 189, 230, 73, 365/75, 77

[56] References Cited

U.S. PATENT DOCUMENTS 3,760,382  9/1973  Itoh ........................................ 365/73

Primary Examiner—Terrell W. Fears
Attorney, Agent, or Firm—Karl F. Ross

[57] ABSTRACT

A stack memory device which comprises a memory stack of n-bit registers with gating circuiting controlled by code inverters to allow first in - first out, first in - last out, last in - first out and other selective transfers of data within the stack.

1 Claim, 1 Drawing Figure

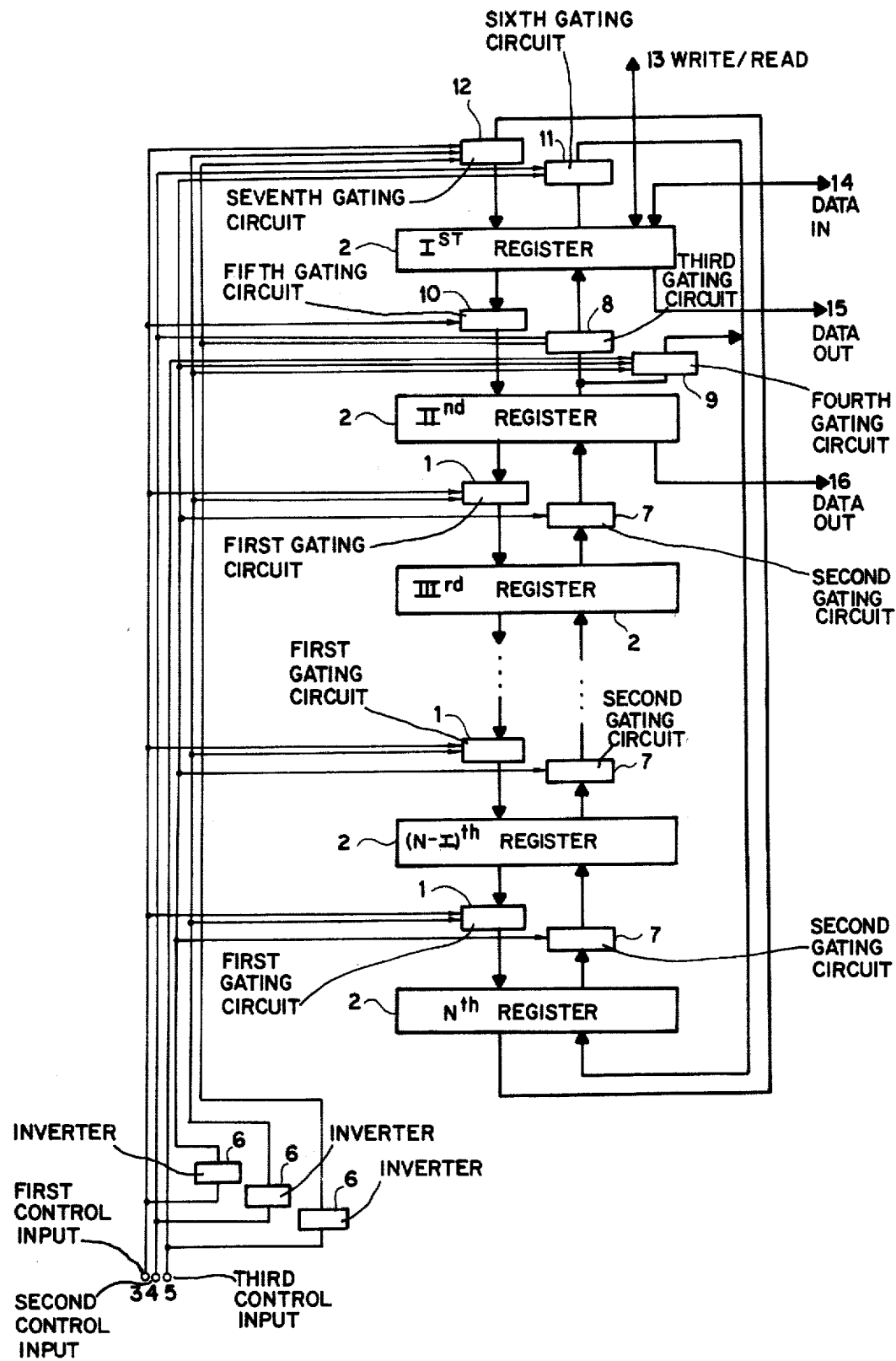

STACK MEMORY DEVICE

FIELD OF THE INVENTION

This invention relates to a stack memory, which is used for the temporary storage of data manipulated by an electronic computer whereby $N$ binary numbers of a length of n-bits can be stored, and which can be used as a part of a processor for large, mini-, or micro-digital electronic computer.

BACKGROUND OF THE INVENTION

A cassette type register memory is known, which is used as a part of a processor in some digital computers, and comprises N n-bit registers, which are serially connected from the first towards the last and vice versa through strobing circuitry for paraphase connection of the registers. This circuitry uses 2n "AND-gates" connected to a control bus in order to transfer the contents of the registers from the first towards the last, i.e. to copy the contents of the first into the second and for the exchange of contents between the first and the second register.

The shortcomings of a cassette memory of this type are: it is impossible to record or retrieve data which was already been manipulated, without violating the order of the data in the memory; and, it is impossible to exchange data between arbitrary registers of the device without taking the data out of the device.

A memory stack is also known which has an indicator for the currently active cell of the stack and the memory cells.

The shortcomings of this stack, which differs from the cassette type memory, are that it is slower in reading into and writing from the memory, and the stack consumes part of the operative memory part of the processor of a digital computer.

OBJECT OF THE INVENTION

The object of this invention is to provide a stack memory device, which has the simple structure of a cassette type memory and has the possibility of transferring register contents "forward" copying of the first register and exchange of the data between the first and the second registers. In addition it should also afford the possibility of saving the contents of the first and the second registers when transferring "forward" and "backward" again into the latter for further use. Finally it should also enable arbitrary exchange between the register contents within the device in response to a specific command sequence.

SUMMARY OF THE INVENTION

This object is achieved in a stack memory which comprises N n-digit registers and strobing circuitry for paraphase connection of the registers, each one of the strobing circuits comprising 2n logical AND-gates. The information inputs of the device are connected to the inputs of the first register, while the outputs from the first and the second registers are the information outputs of the device.

The strobe outputs of the strobing circuitry, through which the outputs of the registers from the second to the one next to last are each connected to the inputs of the next, successively high order register, are connected to the first control input and through an inverter with the second control input, while the strobe-input of the strobing circuitry, through which the inputs of the registers from the second to the one before the last are connected to the outputs of the next register, is connected to the first control input through an inverter.

In addition, the outputs of the second register are connected to the inputs of the first register through a strobing circuit, which strobe-inputs are connected to the second control input and through an inverter with the third control input and to the inputs of the last register through strobing circuitry, whose strobe-inputs are connected to the first control input through an inverter and with the second control input. The inputs of the first register are connected to the outputs of the last register through strobing circuitry, whose strobe-inputs are connected to the first control input, and through inverters with the second and the third control inputs.

The advantages of the device are the possibility for arbitrary parallel exchange of data between the registers, and the possibility of repeated writing of data from the first and the second registers into the last register to be stored for further use, while the structure is kept the same.

The static memory device, according to the invention, allows input and output of data from it to be accomplished by different organizations: "Last in - First out"; "First in - First out", and "First in - Last out", which is an additional advantage of the device. It allows evaluation of arithmetic expressions, with operands which are kept in an arbitrary order within the stack memory. The possibility for arbitrary parallel exchange of data between the registers leads to speeding up of the execution of many algorithms for data processing, which have been loaded into the stack memory device, and as a result to the better utilization of a stack memory device in the design of a central processor for large, mini-, or micro-digital computers.

BRIEF DESCRIPTION OF THE DRAWINGS

The sole FIGURE of the drawing is a block diagram of a stack memory device according to the invention.

SPECIFIC DESCRIPTION

The device shown in the drawing consists of N n-digit registers 2 and strobing circuitry for paraphase connection of the registers. Each one of the strobing circuits consists of 2n AND-gates connected in parallel, while the strobe-inputs of the strobing circuits 1 (FIRST GATING CIRCUITS), through which the outputs of the registers 2 from the second to the one before last are connected to the inputs of the next with increasing number register, are connected to the first control input 3 of the device and through an inverter 6 to the second control input 4. The strobe input of the gating circuit 7, (SECOND GATING CIRCUITS) through which the inputs of the registers 2 from the second (II) to the one before last (N–I) are connected to the outputs of the next with increasing number register I, II. . .(N–II), (N–I), (N), is connected to the first control input through an inverter 6. The outputs of the second register are connected to the inputs of the first register through the strobing circuit 8 (THIRD GATING CIRCUITS), which strobe inputs are connected to the second control input 4 and through an inverter 6 with the third control input 5 of the device, and also to the inputs of the last register through the strobing circuit 9 (FOURTH GATING CIRCUITS), which strobe-inputs are connected to the first and the second control inputs 3 and 4 through inverters 6 and with the third control input 5. The outputs of the first register are connected with the inputs of the second register through the strobing gating circuit 10 (FIFTH GATING CIRCUITS), the strobe input of which is connected to the first line of the control bus 3, similarly to the inputs of the last register through the strobing circuit 11 (SIXTH GATING CIRCUITS), which inputs are connected to the first control input 3 through an inverter 6 and with the second control input 4, while the inputs of the first register are connected also with outputs of the last through the strobing circuit 12 (SEVENTH GATING CIRCUITS), which strobing inputs are connected with the first control input 3 and through inverters with the second and the third control inputs 4 and 5. The inputs 13 and 14 are for loading data into the device and are connected to the inputs of the first register, while the outputs 15 of the first register and 16 of the second register represent the data outputs of the device. The power supply and synchronization inputs of the device are not shown on the figure.

The operation of the stack memory device, according to the invention, is as follows:

When a control code 1 0 0 reaches the control inputs 3,4 and 5, the registers 2 are connected through the code-enabled gating circuits 10, 1, 12 in such way that the content of each register is passed to the following one, with increasing number (i.e. (I) to (II), (II) to (III), ... (N-I) to (N)). The data within the device is moved one step towards the last register, and from the last into the first (N) to (I), i.e. the following transformation has been realized by the device $$\overline{s} = \begin{pmatrix} 1 & 2 & 3 & \ldots & N-1 & N \\ N & 1 & 2 & \ldots & N-2 & N-1 \end{pmatrix}$$

The first row gives the number of the registers, which receive the contents of the corresponding register from the second row of the transformation. When the control code is applied to the inputs 3, 4 and 5 similarly realization of the following transform $$r = \begin{pmatrix} 1 & 2 & 3 & \ldots & N-1 & N \\ 1 & 1 & 2 & \ldots & N-2 & N-1 \end{pmatrix},$$

by which the content of the first register is copied into the second, while the contents of the other registers are moved one step toward the last. The two control codes, mentioned above, are used to load the stack memory device. When the control code is 0 1 0 at the inputs for control 3, 4, 5 the registers 2 are connected through strobing circuits 7, 8, 11, so that the contents of every register are moved forward, while the contents of the first register are stored into the last register, i.e., the device performs the transform $$s = \begin{pmatrix} 1 & 2 & 3 & \ldots & N-1 & N \\ 2 & 3 & 4 & \ldots & N & 1 \end{pmatrix},$$

by which the data within the device are been moved towards the first register for outputting, while the contents of the first register are copied into the last register and could be used later, if needed. When the control code is 0 0 1 the contents of the registers 2 are moved forward from the last to the second through the strobing circuits 7 and 9, while the contents of the first register are saved, i.e., the transformation is $$p = \begin{pmatrix} 1 & 2 & 3 & \ldots & N-1 & N \\ 1 & 3 & 4 & \ldots & N & 2 \end{pmatrix},$$

which is necessary when in the first register some results are being saved as the first operand, while in the third register is the second operand. During the transformation the contents of the second register are saved in the last register and can be used later. When the code at the inputs 3, 4, 5 is 0 1 1 than the transform q is realized $$q = \begin{pmatrix} 1 & 2 & 3 & \ldots & N-1 & N \\ 1 & 3 & 4 & \ldots & N & 1 \end{pmatrix},$$

where the contents of registers 2, from the last to the third are moved forward, while the contents of register one (I) is saved and also copied into the last register (N). The last two control codes play similar role and differ only by the register, from which the data is saved in the last register. When the code is 110 registers one and two exchange their contents, while the contents of the other registers remain unchanged, which is achieved by strobing circuits 10 and 8. The transformation is $$t = \begin{pmatrix} 1 & 2 & 3 & \ldots & N-1 & N \\ 2 & 1 & 3 & \ldots & N-1 & N \end{pmatrix}.$$

This is necessary when for some arithmetic operations there is need to change the places of the two operands. Codes 0 0 0 and 1 1 1 are not allowed. No combination of the control inputs 3, 4 and 5 has been provided under which the contents of any other register is altered. If such transformation is necessary, it must be possible to switch-off the control bus, or a bus-line which allows the exchange should be provided. The bidirectional information inputs 13 can be used to write/read data from peripheral memory devices, while the inputs 14 are used to copy the result from the arithmetic device, the inputs of which are connected the outputs 15 and 16. The paraphasic transmission of information between the registers is necessary, since if the connection between the registers is monophasic the registers which do not change would be made equal to zero. Furthermore this would make the inter-register connections more complicated and would increase the combinatorical part. The transformations S, s, p, t, q, r form the basis in respect to all transformations from the set {1, 2, ... N}. Thus, every parallel exchange between the registers could be realized when the appropriate control word from among the codes is given, when the transformation corresponding to this exchange is expanded into a product of the basic transformations $\overline{S}$, s, p, t, q, r. To find the expansion of an arbitrary transformation existing algorithms and computer programs are used. For example, if the number of registers is N=8, to realize the transform $$\psi = \begin{pmatrix} 1 & 2 & 3 & 4 & 5 & 6 & 7 & 8 \\ 3 & 3 & 1 & 4 & 5 & 6 & 7 & 8 \end{pmatrix}$$

it is necessary to give the following control word: 110, 100, 110, 101, since the expansion of into the basis $\overline{S}$, s, p, t, q, r when N=8 is $\Omega$=r.t.s.t. In the expansion of the transformations multiplication is performed from left to right, while the control word is being formed by taking the basic transformations, but in the opposite order. The transformation $\psi$ is necessary, for example, when the content of the third register is to be raised to the power of two, and the result is to be added to the content of the first register, while the operations that will follow will use the contents of the other registers without change, in the original sequence.

What we claim is:

1. A stack memory device comprising:

a number N of n-bit data registers formed in sequence in a register stack having a first register I, a second register II, intermediate registers III. . . , a next to last register N-I and a last register N;

a first control input, a second control input and a third control input, each having a respective inverter connected thereto;

respective first gating circuits connected between successive registers from said second register II to said last register N and energized by said first input and the inverter of said second input for transferring the contents of each register of said sequence, from said second register on to the next;

respective second gating circuits connected between each register from said last register N to said second register II in reverse order of the stack sequence and energized by the inverter of said first input for transferring the contents of each register from said last register N to register III in said reverse order to the next register of said sequence;

a third gating circuit connected to said second input and to the inverter of said third input while connecting said second register II with said first register I for transferring the contents of said second register II to said first register I;

a fourth gating circuit connected to the inverters of said first and second inputs and to said third input for connecting said second register II with said last register N and transferring the contents of said second register II to said last register N;

a fifth gating circuit connected between said first register I and said second register II and connected to said first input for transferring the contents of said first register I to said second register II;

a sixth gating circuit connecting said first register I with said last register N and connected to said second input and to the inverter of said first input for transferring the contents of said first register I to said last register N;

a seventh gating circuit connecting said last register N to said first register I and energized by said first input, the inverter connected to second input and the inverter connected to said third input for transferring the contents of said first register I to said last register N, whereby the said transfers are effected by coded application of signals to said control inputs selectively;

means for writing out the contents of said first register I and said second register II selectively and independently; and means for writing in data to said first register I.

\* \* \* \* \*